United States Patent
Werner

(10) Patent No.: US 7,600,175 B2
(45) Date of Patent: Oct. 6, 2009

(54) INTEGRATED DIGITAL CIRCUIT AND A METHOD FOR OPERATING A DIGITAL CIRCUIT

(75) Inventor: Christoph Werner, Grafing (DE)

(73) Assignee: Infineon Technologies AG, Munich (DE)

( * ) Notice: Subject to any disclaimer, the term of this patent is extended or adjusted under 35 U.S.C. 154(b) by 785 days.

(21) Appl. No.: 10/479,929

(22) PCT Filed: Jun. 6, 2002

(86) PCT No.: PCT/DE02/02062

§ 371 (c)(1),
(2), (4) Date: Jun. 8, 2004

(87) PCT Pub. No.: WO02/099977

PCT Pub. Date: Dec. 12, 2002

(65) Prior Publication Data

US 2004/0249987 A1  Dec. 9, 2004

(30) Foreign Application Priority Data

Jun. 7, 2001  (DE) ................................ 101 27 649

(51) Int. Cl.
*H03M 13/00* (2006.01)
(52) U.S. Cl. ...................... 714/774; 714/701
(58) Field of Classification Search .................. 714/774
See application file for complete search history.

(56) References Cited

U.S. PATENT DOCUMENTS

| | | | |
|---|---|---|---|
| 3,649,915 A | | 3/1972 | Mildonian, Jr. |
| 4,276,649 A | * | 6/1981 | Groenendaal et al. ....... 714/809 |
| 4,945,549 A | * | 7/1990 | Simon et al. ................. 375/280 |
| 5,251,214 A | * | 10/1993 | Mertens et al. ............. 370/475 |
| 6,067,646 A | * | 5/2000 | Starr .......................... 714/701 |
| 6,182,264 B1 | * | 1/2001 | Ott .............................. 714/774 |
| 6,209,055 B1 | * | 3/2001 | Durham et al. ............. 710/316 |
| 6,280,794 B1 | * | 8/2001 | Tu et al. ..................... 427/99.2 |
| 6,396,393 B2 | * | 5/2002 | Yuasa ......................... 375/260 |
| 6,438,717 B1 | * | 8/2002 | Butler et al. ................ 714/704 |
| 6,816,987 B1 | * | 11/2004 | Olson et al. ................. 714/704 |
| 6,985,510 B2 | * | 1/2006 | Willenegger ................ 375/141 |

FOREIGN PATENT DOCUMENTS

EP  0978875  2/2000

OTHER PUBLICATIONS

Grams, T., "Codierungsverfahren [Coding Methods]," B1 Hochschultaschenbücher, 625, 1986, S. 64 ff.

(Continued)

*Primary Examiner*—Cynthia Britt
*Assistant Examiner*—Steve Nguyen
(74) *Attorney, Agent, or Firm*—Dicke, Billig, Czaja PLLC

(57) ABSTRACT

In an integrated digital circuit, at least one derived data signal is generated from a data signal that is to be transmitted via a line of the digital circuit, by inverting at least two bits of the data signal. The circuit is also provided with an evaluation unit for evaluating the susceptibility of the data signal and the derived data signal, or of derived data signals to interference caused by a capacitive coupling of the line to at least one neighboring line.

23 Claims, 2 Drawing Sheets

OTHER PUBLICATIONS

Kawaguchi, T., et al., "A Reduced Clock-Swing Flip-Flop (RCSFF) for 63% Power Reduction," IEEE Journal of Solid-State Circuits, vol. 33, No. 5, pp. 807-811, May 1998.

Kahng, A.B., et al., "Interconnect Tuning Strategies for High-Performance IC's," Proc. Design, Automation and Testing in Europe, Paris, Feb. 1998.

Favalli, M., et al., "Optimization of Error Detecting Codes for the Detection of Crosstalk Originated Errors," IEEE Proceedings, pp. 290-296, 2001.

Victor, B., "Data Encoding to Prevent Crosstalk Delay," http://www.cad.eecs.berkeley.edu/~niraj/ee244/projects/victor.ppt>, pp. 1-64, Feb. 27, 2001.

Concise explanation of Non-English reference, "Codierungsverfahren."

Kawaguchi et al., Delay and Noise Formulas for Capacitively Coupled Distributed RC Lines, IEEE Proceedings of Design Automation Conference, Feb. 10-13, 1998, pp. 35-43.

* cited by examiner

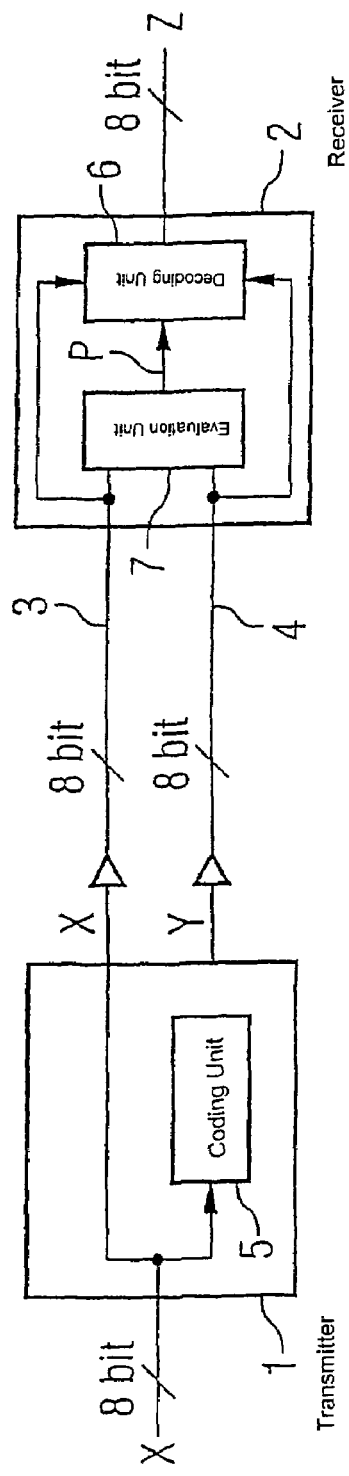
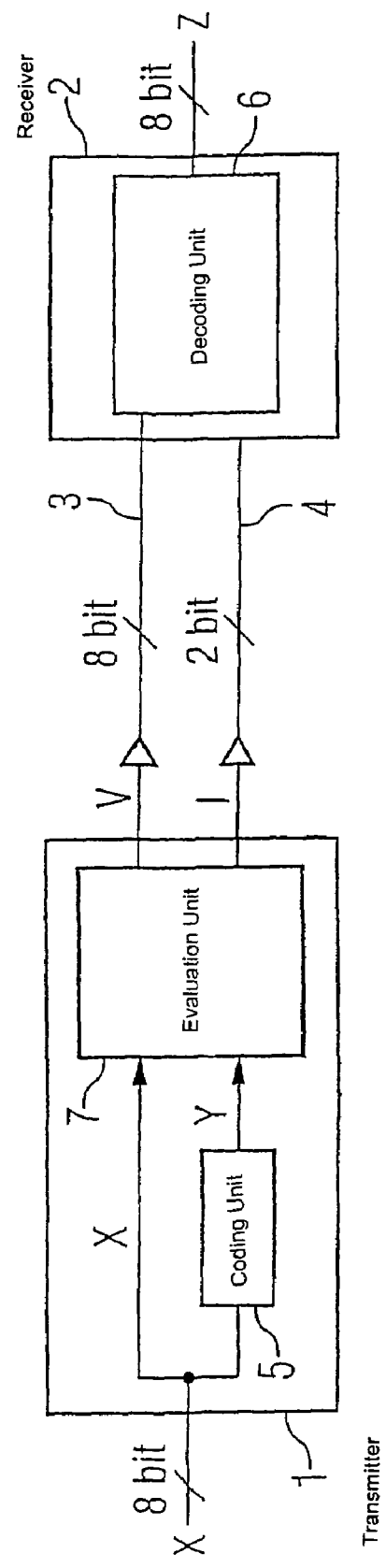

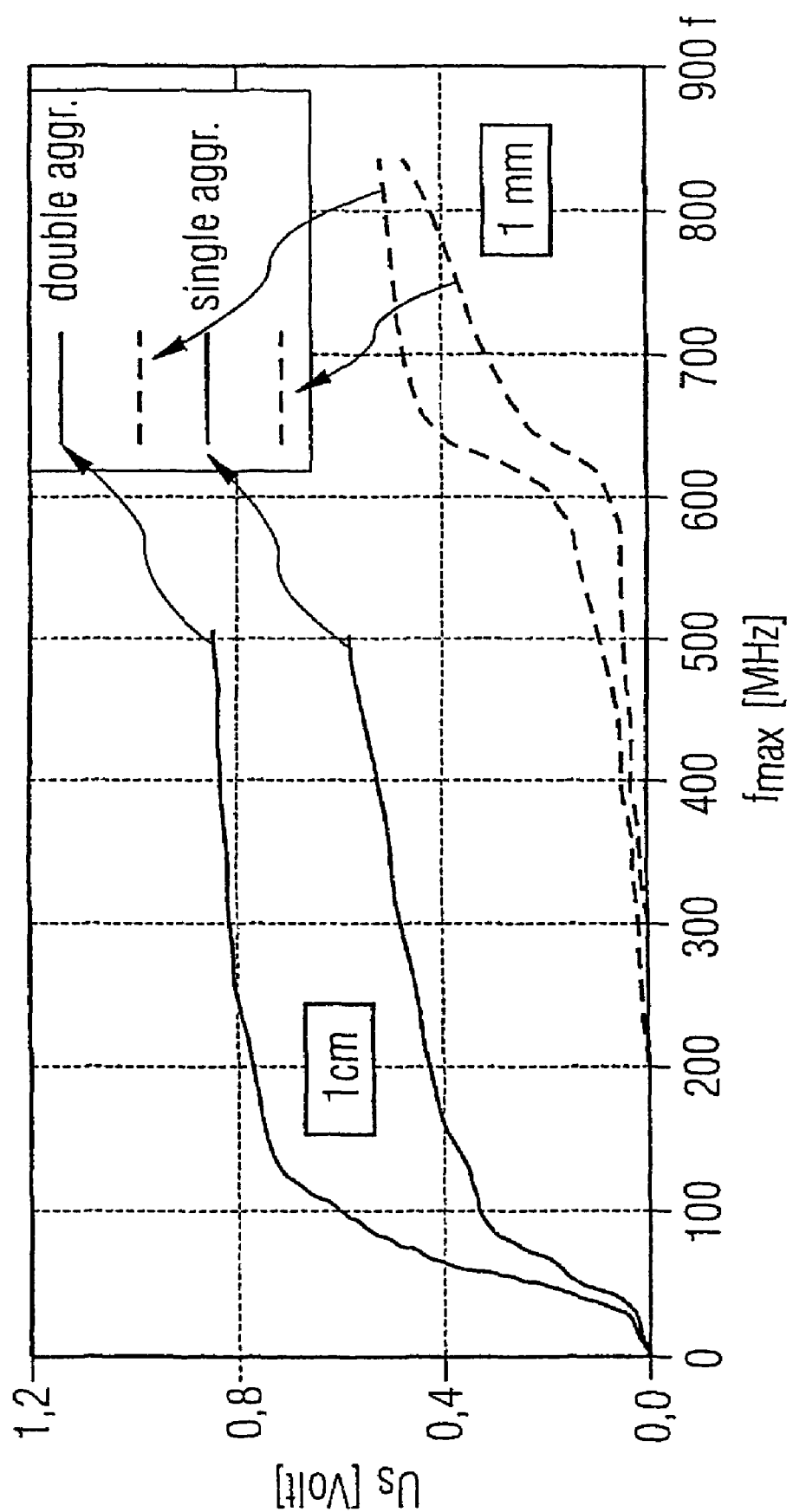

INTEGRATED DIGITAL CIRCUIT AND A METHOD FOR OPERATING A DIGITAL CIRCUIT

CROSS-REFERENCE TO RELATED APPLICATIONS

This application is a U.S. National-Stage entry under 35 U.S.C. § 371 based on International Application No. PCT/DE02/02062, filed 6 Jun. 2002, which was published under PCT Article 21(2); this application also claims priority under 35 U.S.C. § 119 to German Application No. DE 101 27 649.4, filed Jun. 7, 2001, which is incorporated herein by reference.

BACKGROUND OF THE INVENTION

The invention relates to an integrated digital circuit and to a method for operating an integrated digital circuit.

Digital circuits are becoming increasingly more integrated and work at increasingly higher operating frequencies. This trend is in fact leading to increasingly powerful digital circuits on ever smaller surface areas and thus to new applications.

On the other hand, larger scale integration and higher operating frequencies create problems. With digital logic circuits with structure sizes of less than 0.25 μm, the crosstalk between neighboring interconnects on the chip of the integral circuit arrangement presents a considerable level of interference for signal traffic within the logic circuit. The crosstalk is caused by the capacitive coupling of neighboring interconnects. In particular, when the logic circuit is clocked at an operating frequency of 1 GHz or above, erroneous signals can occur on the signal lines of the chip or delay times can be unduly increased, due to the capacitive coupling of interference signals.

According to Kahng, A. B., et al, "Interconnect Tuning Strategies for High Performance IC's," Proc. Design, Automation and Testing in Europe, Paris, February 1998, so-called repeater modules are introduced into the signal path to eliminate erroneous useful signals in an integrated digital logic circuit. These repeater modules are arranged in the signal path after relatively short signal sections and refresh the disturbed signal. Alternatively or in addition, according to Kahng et al., shielding lines can be arranged between signal-carrying lines. Both solutions are characterized by an increased space requirement and cause a significant increase in the chip area, particularly when repeater modules or shielding lines are incorporated systematically over the whole surface.

Erroneous signals on a chip can, however, also be detected by suitable coding and corrected if necessary. With known classical error detecting codes, errors in the digital signal are detected by transmitting and evaluating additional parity check bits, for example, see T. Grams, Codierungsverfahren [Coding Methods], B 1 Hochschultaschenbücher, 625, 1986, pp. 64 ff.

A high level of redundancy is required on account of the specific combination of bit sequences, with which interference due to crosstalk occurs. Also, it is not possible to obtain erroneous signals in the correct form by repeating the transmission process, as crosstalk is not a statistically determinable process. If the same signal is re-transmitted, the errors can recur in the same manner.

SUMMARY OF THE INVENTION

An object of the invention is to specify an integrated digital circuit and a method for operating an integrated digital circuit, which provide for reliable transmission of data in a simple manner.

An integrated digital circuit according to the invention includes a line for transmitting data signals containing several bits and a coding unit for producing at least one data signal derived from a data signal to be transmitted over the line by changing the bit sequence of the data signal to be transmitted. Further, an evaluation unit is provided for evaluating the susceptibility of the data signal and the derived data signal or the derived data signals to interference caused by capacitive coupling of the line to at least one neighboring line. In the context of the invention, as a unit of information, a bit can assume two states, but also, if need be, more than two states.

The invention solves the basic problem and thus the problem of crosstalk by changing the data signals to be transmitted. Code words with several bits are transmitted with these data signals. In doing so, the code word to be transmitted is changed in a systematic way by exchanging two or more bits of the code word before transmission. In doing so, one or even more derived code words can be produced from the code word to be transmitted. The process of exchanging bits of a code word and thus changing the bit sequence is also called interleaving. The derived code words resulting from the change are then checked for their respective susceptibility to crosstalk errors during transmission with the help of a calculation unit, also called a penalty function.

By means of the invention, errors caused by crosstalk in signals to be transmitted can therefore be detected and, in particular, modified data signals produced from the data signal to be transmitted can be determined, which are more resistant to the interference effect of crosstalk than, for example, the actual data signal to be transmitted.

This information on the susceptibility to interference of individual variations of the data signal to be transmitted can be used to advantage to the effect that only that data signal from the derived data signals and the data signal to be transmitted, which is shown to be the least susceptible with regard to crosstalk interference, is transmitted. This does not necessarily have to be the actual data signal to be transmitted with its original bit sequence but, for example, is a data signal derived from this with the same bits but a different bit sequence. In the interest of further increased transmission reliability, it is also possible to transmit several derived data signals, preferably those that are shown to be least susceptible to interference.

Alternatively, the data signal to be transmitted and the derived data signal or the derived data signals—if need be also without the actual data signal to be transmitted—are transmitted to the receiver. The evaluation of the transmitted signals with regard to the susceptibility to interference is then carried out in the receiver.

To reconstruct the actual data signal to be transmitted, in both alternatives an information signal is preferably transmitted to the receiver, which contains information concerning the exchange process with regard to the derived data signals transmitted. Information in this regard contains, for example, the information on whether the original data signal to be transmitted, or one or more data signals derived from this, have been transmitted and which exchange process has been used for the individual derived data signals. In doing so, the information as to which exchange process has been used is sufficient as long as the exchange process itself is known to the receiver.

At the same time, the invention is based on the knowledge that the interference mechanism of crosstalk between two neighboring lines is physically known and is not characterized by random noise.

With the transmitted data signal or the transmitted data signals and, if necessary, with the information from the information signal, the actual data signal to be transmitted can be reconstructed in the receiver and made available for further processing by means of a decoding unit.

Preferably, the digital circuit includes a receiver for receiving the data signals transmitted over the line. A decoding unit can be provided at the receiver end for determining, in the sense of reconstructing, the data signal to be transmitted from signals actually transmitted over the line. Preferably, a transmitter is provided for outputting data signals onto the line. This transmitter also contains the coding unit. At the same time, the transmitter can be designed for outputting the data signal to be transmitted and the derived data signal or the derived data signals to the line, offset with respect to time. In this mode, signals are transmitted serially.

A further line can also be provided, however, for transmitting data signals, to which the transmitter outputs the derived data signal or signals. The transmitter is then designed, in particular, for the parallel output of the data signal to be transmitted to the line and of the derived data signal to the further line. Although the provision of the further line increases the area requirement on the chip, it also increases the transmission rate. In the case of serial signal transmission on one line, the main focus lies in a reduced area requirement on the chip.

In an advantageous improvement, the receiver contains the evaluation unit. The data signal to be transmitted and the data signal or signals derived from this or only the derived data signals—for the case where the actual data signal to be transmitted is not transmitted—are transmitted on the line or lines to the receiver, where they are evaluated for their susceptibility to interference.

Preferably, the transmitter sends an information signal to the receiver, specifying which exchange process was used to form the derived data signal or signals from the data signal to be transmitted. With this information and the interference susceptibility data determined in the receiver, the decoding unit of the receiver can reconstruct the actual interference-free data signal to be transmitted from the data signals actually transmitted, which, in particular, also contain at least one derived data signal.

However, the transmitter may also contain the evaluation unit.

The transmitter then selects from the data signal to be transmitted and the derived data signal or from the derived data signals, that data signal which has been evaluated by the evaluation unit as having the least susceptibility to interference, and transmits this data signal to the receiver.

Advantageously, the transmitter also outputs an information signal in this transmission mode, which specifies which exchange process was used to form the selected signal from the signal to be transmitted. With this information and the selected and transmitted data signal, the decoding unit of the receiver can reconstruct the actual data signal to be transmitted. In doing so, the information signal can be transmitted on the same line as the selected data signal.

However, a further line can also be provided for transmitting the information signal. Although the provision of the further line increases the area requirement on the chip, it also increases the transmission rate. In the case of serial signal transmission on one line, the main focus lies in a reduced area requirement on the chip.

With regard to the advantages of the method and its developments, reference is made to the statements relating to the device claims. With the method, at least one derived data signal is produced from a data signal to be transmitted over a line of the digital circuit by changing the bit sequence. The susceptibility of the data signal and the derived data signal or the derived data signals to interference caused by a capacitive coupling of the line to at least one neighboring line is subsequently determined.

Preferably, the data signal to be transmitted and the derived data signal or the derived data signals are transmitted over the line, offset with respect to time. In one advantageous development, the data signal to be transmitted is transmitted on the line and the derived data signal on a further line. The susceptibility to interference of the data signal and each derived data signal or the derived data signals is preferably determined in the receiver after transmission of the data signals over the line. The data signal to be transmitted is then determined from the actually transmitted data signals with the help of the interference susceptibility data.

The susceptibility to interference of the data signal to be transmitted and each derived data signal or the derived data signals can, however, also be determined before their transmission. Then, preferably, that data signal which is least susceptible to interference is selected from the data signal to be transmitted and the derived data signal or from the derived data signals, and is transmitted on the line.

An information signal can be output specifying which exchange process was used to derive the selected and transmitted signal from the signal to be transmitted. At the same time, the information signal can be transmitted on the line, offset with respect to time with respect to another data signal transmitted.

However, the information signal can also be transmitted on a further line.

In the receiver, the data signal to be transmitted is preferably determined from the actually transmitted data signal or signals with the help of the transmitted information signal.

BRIEF DESCRIPTION OF THE DRAWINGS

Exemplary embodiments of the invention are shown in the figures and are described in more detail in the following, in which:

FIG. 1 shows a block diagram of a first exemplary embodiment of a digital circuit according to the invention;

FIG. 2 shows a block diagram of a further exemplary embodiment of a digital circuit according to the invention;

FIG. 3 shows a diagram, which illustrates the relationship between the error frequency of signals in a digital circuit as a function of operating parameters.

The same elements and signals are allocated the same references across all the figures.

DETAILED DESCRIPTION

FIG. 1 shows a block diagram of a first exemplary embodiment of the invention. The block diagram of a digital circuit shown in FIG. 1 includes a transmitter 1, which is connected to a receiver 2 via a line 3 and a further line 4. Here, the transmitter 1 and receiver 2 are components of the integrated digital circuit and are defined by the line 3 between them and the direction of the data transmission. The line 3 and the further line 4 are line paths in the chip of the integrated digital circuit, the line length of which can extend between the μm range and the cm range. The transmitter 1 contains a coding unit 5. The receiver 2 contains an evaluation unit 7 and a decoding unit 6.

The digital circuit shown in the detail in FIG. 1 is intended to ensure that a data signal X—in the following, data signal X to be transmitted—is transmitted in a manner resistant to interference over the transmission path defined by line 3, in spite of any crosstalk effect with respect to neighboring signal lines caused by the high operating frequency of the digital circuit.

The data signal X to be transmitted is, for example, an 8-bit code word. In FIG. 1, the number of bit positions of the data signals transmitted on each line is specified, namely by a diagonal slash on the appropriate line and the information relating to the number of bit positions above the diagonal slash.

The data signal X to be transmitted appears without interference at the transmitter 1. The transmitter 1 passes this data signal X to be transmitted to the line 3. The data signal X to be transmitted is also actually transmitted via the line 3, which is susceptible to interference, to the receiver 2.

On the other hand, the data signal X to be transmitted is fed to the coding unit 5. From the data signal X to be transmitted, the coding unit 5 produces a derived data signal Y, which is transmitted via the further line 4 to the receiver 2. The derivation from the data signal X to be transmitted takes place in the coding unit 5 in such a way that the converted data signal Y contains the same bits as the data signal X to be transmitted, but arranged in a different order.

Hence, for example, the data signal X to be transmitted contains the following bit positions:

X=(x0, x1, x2, x3, x4, x5, x6, x7) where each bit position is assigned a digital value 0 or 1.

The coding unit 5 exchanges the bit positions systematically in such a way that the derived data signal Y results from the data signal X to be transmitted by the following bit position sequence:

Y=(x0, x2, x4, x6, x1, x3, x5, x7)

The two data signals X and Y are transmitted to the receiver 2 on the associated lines 3 and 4, respectively. Alternatively, however, the data signals X and Y can also be transmitted serially to the receiver 2 on a common line 3.

In the receiver 2, the evaluation unit 7 for evaluating the susceptibility of the data signals fed to it to interference caused by capacitive coupling of the line to at least one neighboring line evaluates the transmitted data signal X and the derived transmitted data signal Y. This evaluation routine carried out by the evaluation unit 7 is also called a penalty function, and is in the form of hardware or software.

The penalty function can assume three evaluation states for one bit of a received data signal: The penalty evaluation returns the value Zero when, during transmission, there is no switching activity on either of the neighboring lines of the transmission line, i.e. no crosstalk has taken place. The evaluation One is returned when, during transmission, just one of the neighboring lines of the transmission line switches to the transmitted signal. The evaluation Two is returned when, during transmission, both neighboring lines of the transmission line switch to the transmitted signal, i.e. crosstalk with respect to both neighboring lines takes place.

The penalty function can accordingly be represented as follows:

Penalty $(i, tn) = $ 1, when either $x(i-1, tn)$ is not equal to $x(i-1, tn-1)$ and $x(i, tn)$ is not equal to $x(i-1, tn)$ or $x(i+1, tn)$ is not equal to $x(i+1, tn-1)$ and $x(i, tn)$ is not equal to $x(i+1, tn)$ Penalty $(i, tn) = $ 2, when both $x(i-1, tn)$ is not equal to $x(i-1, tn-1)$ and $x(i, tn)$ is not equal to $x(i-1, tn)$ and also $x(i+1, tn)$ is not equal to $x(i+1, tn-1)$ and $x(i, tn)$ is not equal to $x(i+1, tn)$ Penalty $(i, tn) = $ 0 otherwise, where x is the bit value of the transmitted data signal, i is the transmission line, i−1 and i+1 are lines adjacent to this and tn and tn−1 are the point in time or the previous point in time, respectively, at which the respective bit value x is observed.

The transmitted data signal X and the derived data signal Y are fed to the decoder 6 in the receiver unit 2, as also are the evaluation results P, which are determined by the evaluation unit 7, for example in the form of the bit-related penalty function P(i,tn) described above.

The decoder 6 now selects, bit position by bit position, from the transmitted data signal X and the transmitted derived data signal Y that bit, which has the smaller penalty function at this position and which is therefore more resistant to interference. The actual, original data signal X without interference to be transmitted is accordingly pieced together in the decoder 6.

In the transmission mode described above with the transmission of only one converted data signal Y, the decoder 6 preferably knows the exchange function of the bits to obtain the derived data signal Y from the data signal X to be transmitted. This information is used to get back the data signal without interference to be transmitted.

If this information is not available at the receiver end, then it can be transmitted by means of an information signal from the transmitter 1 to the receiver 2 via the line 3 or the further line 4.

If two or more data signals Y are derived from the data signal X to be transmitted, then the information concerning each derivation must be fed to the receiver 2, if it is not already stored in a memory of the receiver. At the same time, relations can also be stored in the receiver in such a way that a sequence of exchange processes is stored for a series of sequentially incoming derived data signals Y at the receiver 2, or that one exchange process is permanently assigned to a particular line and to the data signals transmitted over it.

The receiver 2 outputs the reconstructed data signal to be transmitted as an output signal Z.

FIG. 2 likewise shows a block diagram of a digital circuit according to the invention with the following variation compared to the digital circuit according to FIG. 1: The evaluation unit 7 is now not arranged in the receiver 2 but in the transmitter 1. It follows from this that the penalty function is carried out right at the transmitter.

Again, the data signal X to be transmitted and a data signal Y, derived by the coding unit 5 in accordance with the above measures from the data signal X to be transmitted, are fed to the evaluation unit 7. The evaluation unit 7 now determines the resistance to interference of the two data signals X and Y, preferably based on the penalty function described above. Subsequently, the evaluation unit 7 selects the more resistant to interference of the two data signals X and Y and transmits this to the receiver via the line 3 as the selected data signal V.

The receiver is informed by means of a 2-bit information signal I via the further line 4 which exchange process was used to derive the selected data signal V from the data signal X to be transmitted. In the case of only one single line 3, the information signal I can also be transmitted time-division-multiplexed with the selected data signals V.

According to the invention, the data signal V can be selected as follows: That signal from the data signals X and Y provided by the evaluation unit is transmitted, which has the lowest penalty average over the bit positions, provided that the lowest penalty value displays the highest resistance to interference.

Preferably, only that data signal which is absolutely resistant to interference is selected, i.e. which has a penalty average of Zero. Otherwise—in particular therefore if, for example, it can be expected that all data signals available for selection will have crosstalk interference during transmission—two or more data signals according to the exemplary embodiment of FIG. 1 can be transmitted to the receiver 2.

When it can be expected that all data signals available for selection will have crosstalk interference during transmission, an additional data signal can be derived by means of a further exchange function (interleaving algorithm), which is subsequently checked for its resistance to interference and on establishing its resistance to interference is selected and transmitted.

If it is established that the selected data signal with the lowest resistance to interference nevertheless allows crosstalk to a small extent, for instance only due to coupling with one single neighboring line, then this data signal can be transmitted and crosstalk avoided by means of further measures such as appropriate process control and/or interconnect layout and/or by reducing the operating frequency. Reliable signal transmission is then also guaranteed when the selected data signal is evaluated with a value of One according to the above penalty function. Only when a penalty value of Two has been established should at least one further derived data signal be transmitted in addition.

FIG. 3 shows a diagram which illustrates the relationship between the error frequency of signals in a digital circuit as a function of operating parameters. The operating frequency f of the digital circuit in MHz is entered on the abscissa and, on the ordinate, the amplitude of interference peaks $U_s$ in Volts as a function of the operating frequency f on a bus line of the digital circuit.

Further, the interference peaks are shown as a function of two typical crosstalk faults, namely the single aggressor fault and the double aggressor fault. With the single aggressor fault, a neighboring line is switched simultaneously, whereas with a double aggressor fault, two neighboring lines are switched simultaneously.

Furthermore, the interference peak variable is shown as a function of the line length of the bus line, namely for a line length of 1 cm and of 1 mm.

The technological parameters are based on the 0.25 μm CMOS logic generation and values of the coupling capacitances of the bus lines are taken from the Kahng reference described above.

The digital circuit is created using 0.25 μm technology and the bus lines are arranged in the metallization layer M3. The interconnect geometry is determined by an interconnect height of 0.45 μm, an interconnect width of 1.2 μm and an interconnect distance of 1.0 μm.

SiO$_2$ is used as the dielectric. The resulting coupling capacitances are $C_{couple}$=75 fF and $C_{ground}$=40 fF. The supply voltage is $V_{dd}$=2.5 Volt.

In general, it can be stated that, with low line length, the amplitude of the interference peaks increases significantly only at higher operating frequencies, whereas, with long lines in the cm range, high-level interference peaks occur even at low operating frequencies.

A typical limiting level for permitted interference peaks in the above technology is, for example, 0.4 Volt. If the digital circuit is operated at an operating frequency of about f=300 MHz, then interference signals of about 0.8 Volt appear on 1 cm lines when there is interference from two neighboring lines, and interference signals of about 0.5 Volt when there is interference from only one neighboring line. Without the use of the transmission method according to the invention, the occurrence of logical errors due to crosstalk is therefore to be expected on such lines.

However, if the method according to the invention is used and the transmission of all data signals with a penalty value greater than Zero is avoided, then transmission can be carried out free of errors.

If the operating frequency is reduced to f<200 MHz, then interference levels from single aggressor faults fall to less than 0.4 Volt, i.e. in particular under the tolerance level. It is then also possible to transmit data signals with a calculated penalty value of One without errors. Only for the transmission of data signals with a penalty value of Two should two or more data signals derived according to the interleaving method then be transmitted.

As an alternative to the penalty function described in conjunction with the exemplary embodiments according to FIGS. 1 and 2, the following penalty function from H. Kawaguchi, T. Sakuri, IEEE proceedings 07803-4425-1/98 p. 38—the content of which is hereby introduced as belonging to the disclosure—can be used:

$$\text{Penalty} = \frac{n}{n+1}\left[K_1\left(\frac{K_1 \cdot \sigma_1}{K'_k \cdot \sigma'_1}p\right)^{-\frac{p \cdot \sigma_1}{p \cdot \sigma_1 + \sigma'_1}} - K'_1\left(\frac{K_1 \cdot \sigma_1}{K'_k \cdot \sigma'_1}p\right)^{\frac{\sigma'_1}{p \cdot \sigma_1 + \sigma'_1}}\right] \quad (1)$$

Where n is the number of neighboring lines, $R_T$ is the equivalent resistance of the driver MOSFET divided by the total resistance of the line;

$C_T$ is the equivalent capacitance of the driver MOSFET divided by the total resistance of the line;

η is the equivalent coupling capacitance to neighboring lines divided by the total capacitance of the line concerned;

$$p = 1 + (n+1) \cdot \eta, \quad (2)$$

$$K_1 = -1.01 \cdot \frac{R_T + C_T + 1}{R_T + C_T + \frac{\pi}{4}}, \quad (3)$$

$$K'_1 = -1.01 \cdot \frac{R_T + \frac{C_T}{p} + 1}{R_T + \frac{C_T}{p} + \frac{\pi}{4}}, \quad (4)$$

$$\sigma_1 = \frac{1.04}{R_T \cdot C_T + R_T + C_T + \left(\frac{2}{\pi}\right)^2}, \quad (5)$$

-continued $$\sigma'_1 = \frac{1.04}{\frac{R_T \cdot C_T}{p} + R_T + \frac{C_T}{p} + \left(\frac{2}{\pi}\right)^2}. \quad (6)$$

LIST OF REFERENCES

1 Transmitter
2 Receiver
3 Line
4 Further line
5 Coding unit
6 Decoding unit
7 Evaluation unit
X Data signal to be transmitted
Y Converted data signal
V Selected data signal
Z Output signal
I Information signal
P Evaluation result

The invention claimed is:

1. An integrated digital circuit, comprising:
   a line for transmitting data signals with several bits,
   a coding unit for producing at least one derived data signal from a data signal to be transmitted over the line by changing the bit sequence of the data signal to be transmitted such that the derived signal contains the same bits as the data signal but arranged in a different order;
   an evaluation unit for evaluating the susceptibility of the data signal and the derived data signal to interference caused by a capacitive coupling of the line with at least one neighboring line; and
   a transmitter for outputting data signals onto the line, and which transmits the one of the data signal and the derived data signal which has been evaluated by the evaluation unit as having the least susceptibility to interference as caused by capacitive coupling.

2. The integrated digital circuit as claimed in claim 1, further comprising a receiver for receiving the data signals transmitted over the line.

3. The integrated digital circuit as claimed in claim 2, further comprising a decoding unit at the receiver end for determining the data signal to be transmitted from signals actually transmitted over the line.

4. The integrated digital circuit as claimed in claim 1, in which the transmitter contains the coding unit.

5. The integrated digital circuit as claimed in claim 4, in which the transmitter is designed for outputting the data signal to be transmitted and the derived data signal to the line, offset with respect to time.

6. The integrated digital circuit as claimed in claim 4, further comprising a further line for transmitting data signals, in which the transmitter is designed for outputting the derived data signals to the further line.

7. The integrated digital circuit as claimed in claim 6, in which the transmitter is designed for parallel output of the data signal to be transmitted to the line and of the derived data signal to the further line.

8. The integrated digital circuit as claimed in claim 4, in which the transmitter contains the evaluation unit.

9. The integrated digital circuit as claimed in claim 2, in which the receiver contains the evaluation unit.

10. The integrated digital circuit as claimed in claim 9, in which the transmitter is designed to output an information signal, which specifies which exchange process was used to form the derived data signal from the signal to be transmitted.

11. The integrated digital circuit as claimed in claim 10, in which the transmitter is designed for outputting the information signal to the line.

12. The integrated digital circuit as claimed in claim 10, further comprising a further line for transmitting the information signal.

13. The integrated digital circuit as claimed in claim 1, in which the transmitter is designed to output an information signal, specifying which exchange process was used to form the selected signal from the signal to be transmitted.

14. A method for operating an integrated digital circuit, comprising:
    producing at least one derived data signal from a data signal to be transmitted over a line of the digital circuit by exchanging the bit sequence such that the derived signal contains the same bits as the data signal but arranged in a different order;
    determining susceptibility of the data signal to be transmitted and the derived data signal to interference caused by capacitive coupling of the line to at least one neighboring line;
    selecting from the data signal to be transmitted and each derived data signal that data signal which is least susceptible to interference as caused by capacitive coupling; and
    transmitting the selected data signal on the line.

15. The method for operating an integrated digital circuit as claimed in claim 14, in which the data signal to be transmitted and the derived data signal are transmitted over the line, offset with respect to time.

16. The method for operating an integrated digital circuit as claimed in claim 15, in which the data signal to be transmitted is transmitted on the line and the derived data signal is transmitted on a further line.

17. The method for operating an integrated digital circuit as claimed in claim 14, in which the susceptibility to interference of the data signal and of the derived data signal is determined in the receiver after transmission of the data signals over the line.

18. The method for operating an integrated digital circuit as claimed in claim 17, in which the signal to be transmitted is determined from actually transmitted data signals with the help of the interference susceptibility determination.

19. The method for operating an integrated digital circuit as claimed in claim 14, in which the susceptibility to interference of the data signal to be transmitted and each derived data signal is determined before a possible transmission.

20. The method for operating an integrated digital circuit as claimed in claim 14, in which an information signal is output, specifying which exchange process was used to derive a transmitted signal from the signal to be transmitted.

21. The method for operating an integrated digital circuit as claimed in claim 20, in which the information signal is transmitted on the line, offset with respect to time with respect to another data signal.

22. The method for operating an integrated digital circuit as claimed in claim 20, in which the information signal is transmitted on a further line.

23. The method for operating an integrated digital circuit as claimed in claim 20, in which the data signal to be transmitted is determined from an actually transmitted data signal or signals with the help of the transmitted information signal.

* * * * *